United States Patent
Nuriya et al.

(10) Patent No.: US 10,765,016 B2
(45) Date of Patent: Sep. 1, 2020

(54) WATERPROOF TYPE SUBSTRATE HOUSING CASE

(71) Applicant: Mitsubishi Electric Corporation, Tokyo (JP)

(72) Inventors: Nobuaki Nuriya, Tokyo (JP); Soichi Sato, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 16/384,281

(22) Filed: Apr. 15, 2019

(65) Prior Publication Data

US 2019/0357371 A1 Nov. 21, 2019

(30) Foreign Application Priority Data

May 15, 2018 (JP) ................................. 2018-093406

(51) Int. Cl.
*H05K 5/06* (2006.01)
*H05K 5/02* (2006.01)
(Continued)

(52) U.S. Cl.
CPC ......... *H05K 5/0052* (2013.01); *H01R 12/716* (2013.01); *H01R 13/41* (2013.01);
(Continued)

(58) Field of Classification Search
CPC .... H05K 5/0052; H05K 5/069; H05K 5/0247; H05K 5/0017; H05K 5/0056;
(Continued)

(56) References Cited

U.S. PATENT DOCUMENTS 9,337,568 B2 * 5/2016 Endo .................. H01R 13/4365
10,177,488 B2 * 1/2019 Zhao .................. H01R 13/5219
(Continued)

FOREIGN PATENT DOCUMENTS

CN 103022837 A 4/2013
JP 2014-027773 A 2/2014

OTHER PUBLICATIONS

Communication dated May 25, 2020, issued by the State Intellectual Property Office of the P.R.C. in application No. 201910385738.7.

*Primary Examiner* — Rockshana D Chowdhury
(74) *Attorney, Agent, or Firm* — Sughrue Mion, PLLC; Richard C. Turner

(57) ABSTRACT

The first case made of metal and the second case made of resin seal the circuit substrate 130 hermetically by the adhesive seal material, an engaging elastic member having a hook part is stand up at an inclination angle θ of less than 90 degrees at the front of a plurality of pressing elastic members provided on the outer periphery of the second case, when the first case is mounted by the assembling jig, the engaging elastic member moves backward, when the first case is pushed further, the pressing elastic member is bent upward by the jig base, the hook part is engaged, when the jig is removed, the first case and the second case are pressed against each other by the restoring force of the pressing elastic member, when the adhesive seal material is dried and cured, the adhesion force thereof secures close contact integrity between the cases.

16 Claims, 7 Drawing Sheets

(51) Int. Cl.
   *H05K 5/00*      (2006.01)
   *H01R 13/41*     (2006.01)
   *H01R 12/71*     (2011.01)
   *H01R 13/52*     (2006.01)
   *B60R 16/023*    (2006.01)

(52) U.S. Cl.
   CPC ....... *H01R 13/5202* (2013.01); *H05K 5/0017* (2013.01); *H05K 5/0247* (2013.01); *H05K 5/069* (2013.01); *B60R 16/0239* (2013.01)

(58) Field of Classification Search
   CPC .. H01R 13/41; H01R 12/716; H01R 13/5202; B60R 16/0239
   See application file for complete search history.

(56) References Cited

U.S. PATENT DOCUMENTS

| | | | |
|---|---|---|---|
| 10,333,246 B2 * | 6/2019 | Oishi | H01R 13/5219 |
| 2013/0072040 A1 | 3/2013 | Ohhashi et al. | |
| 2014/0079473 A1 * | 3/2014 | Muro | H01R 13/743 |
| | | | 403/288 |
| 2015/0099385 A1 * | 4/2015 | Ikeya | H01R 12/724 |
| | | | 439/271 |
| 2016/0149337 A1 * | 5/2016 | Ozaki | H01R 13/5202 |
| | | | 439/529 |

* cited by examiner

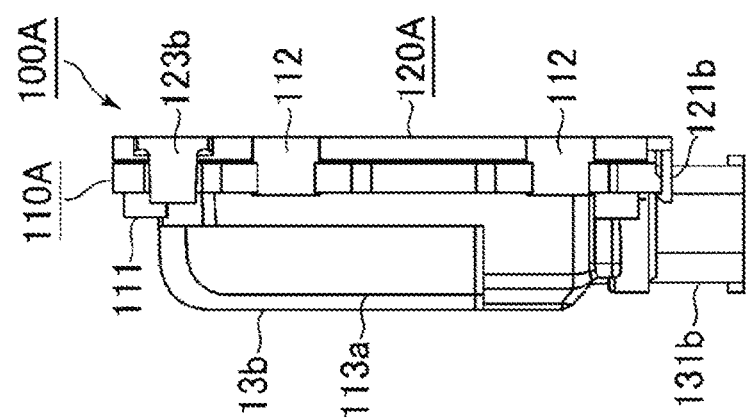
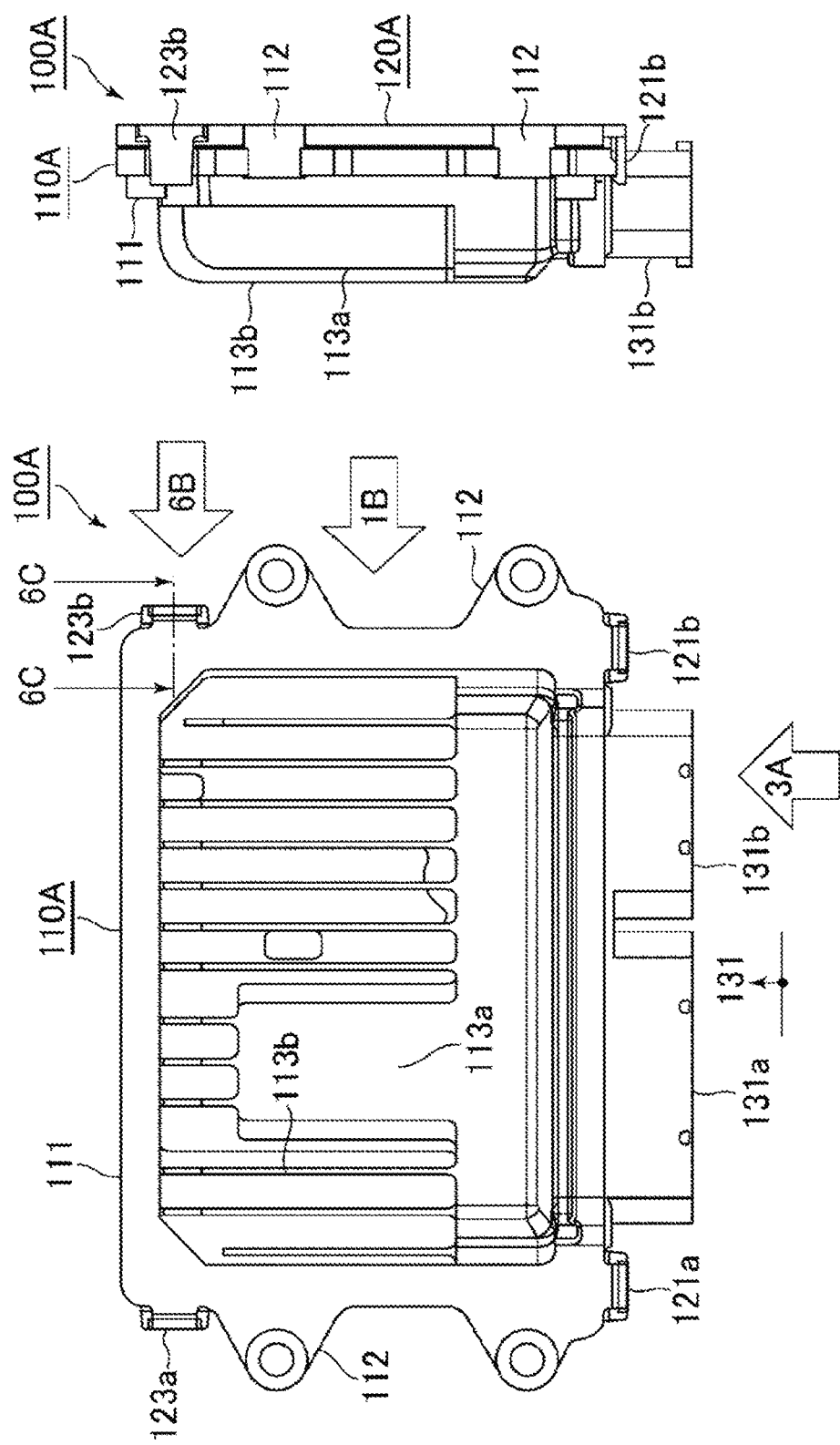

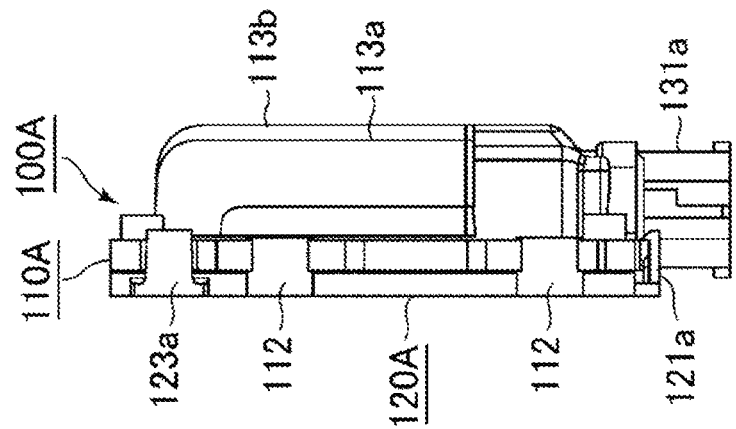
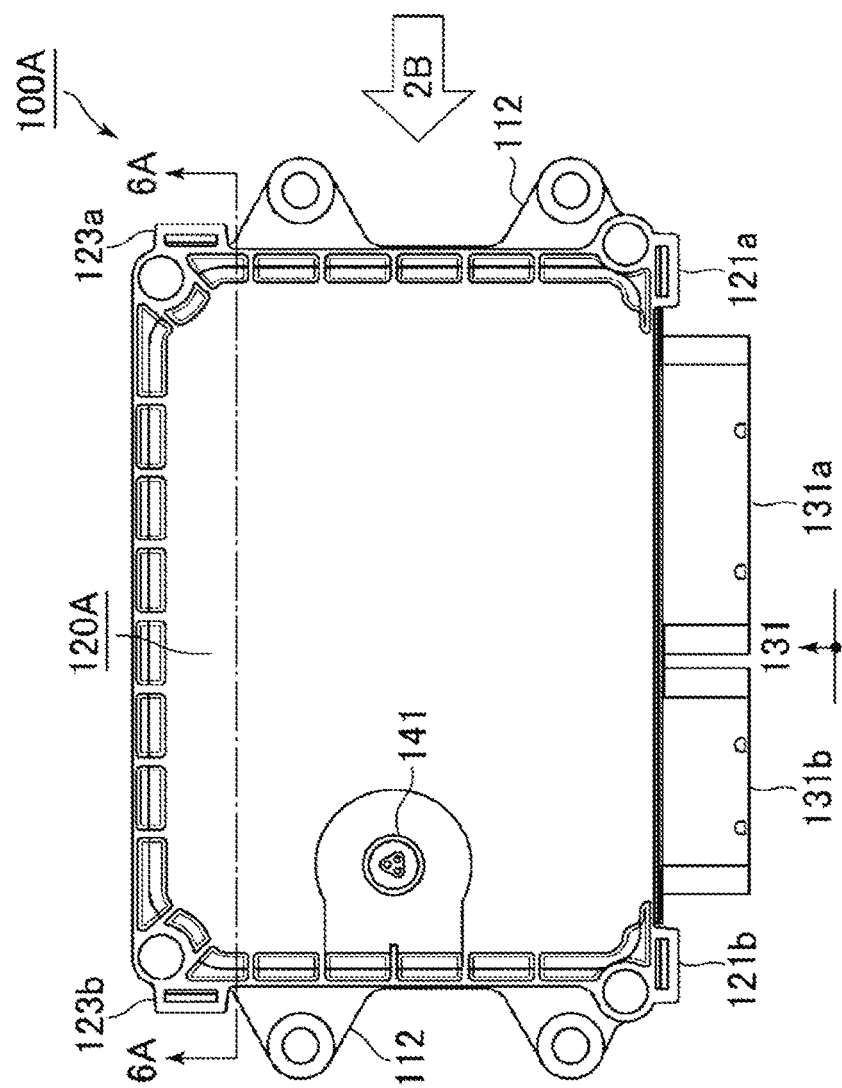

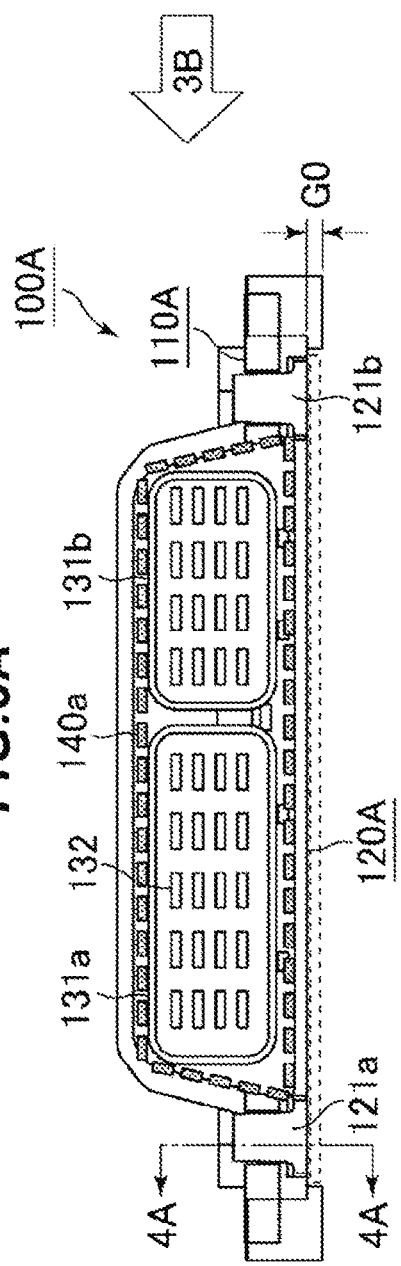
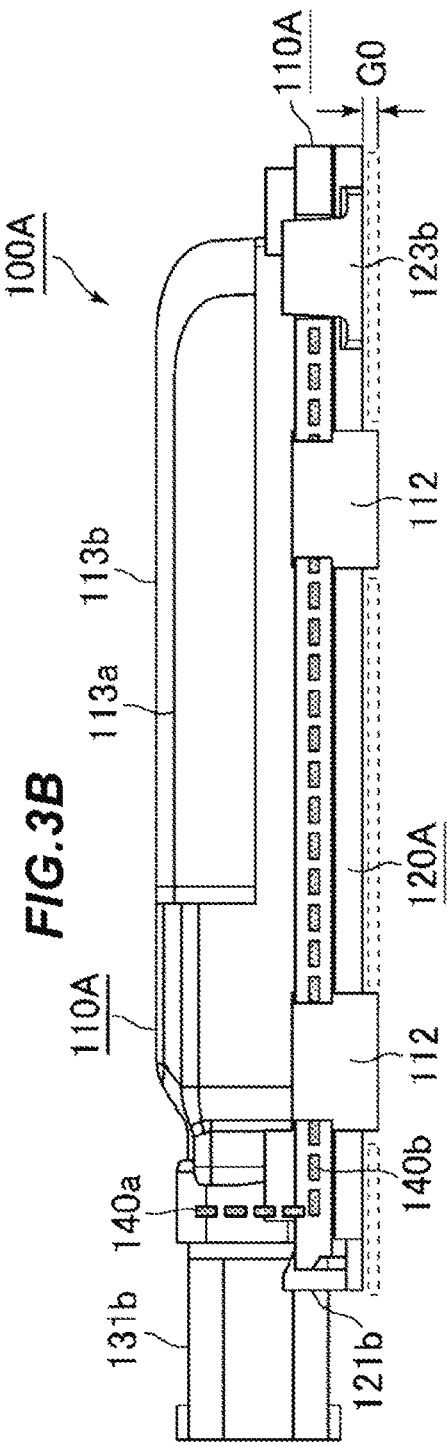

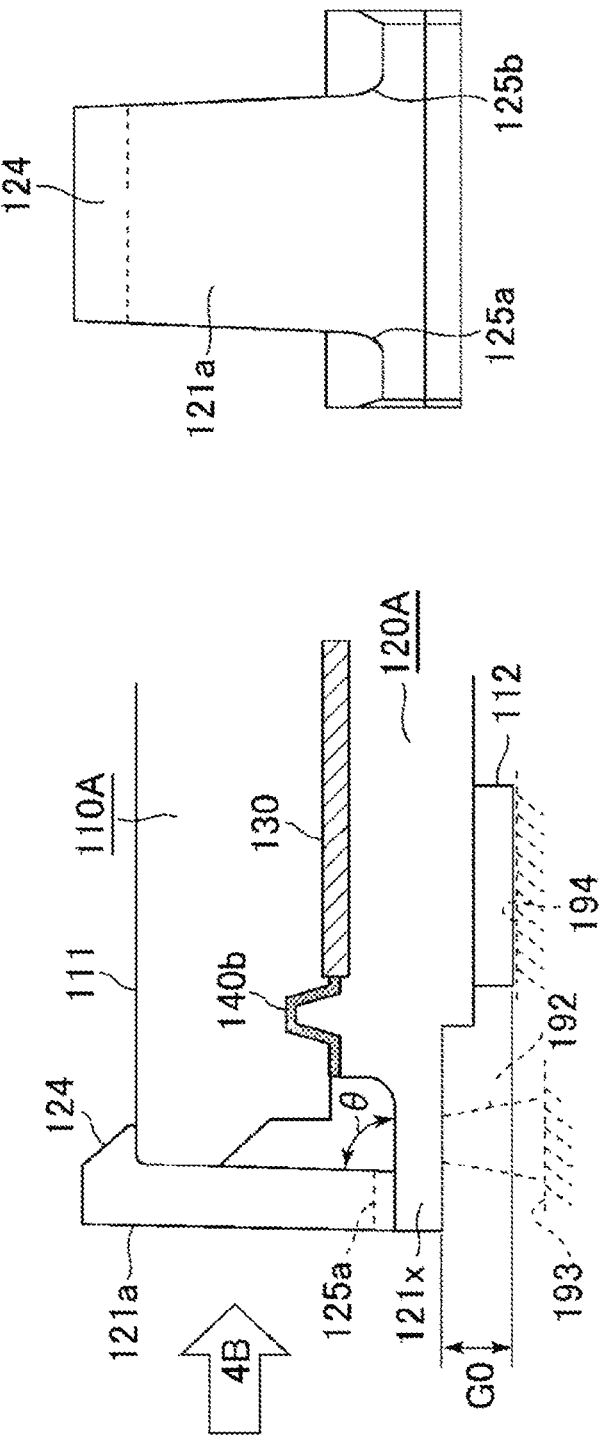

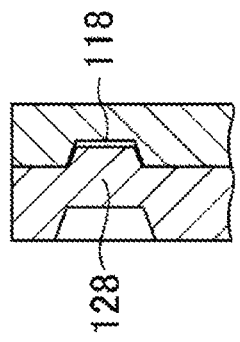
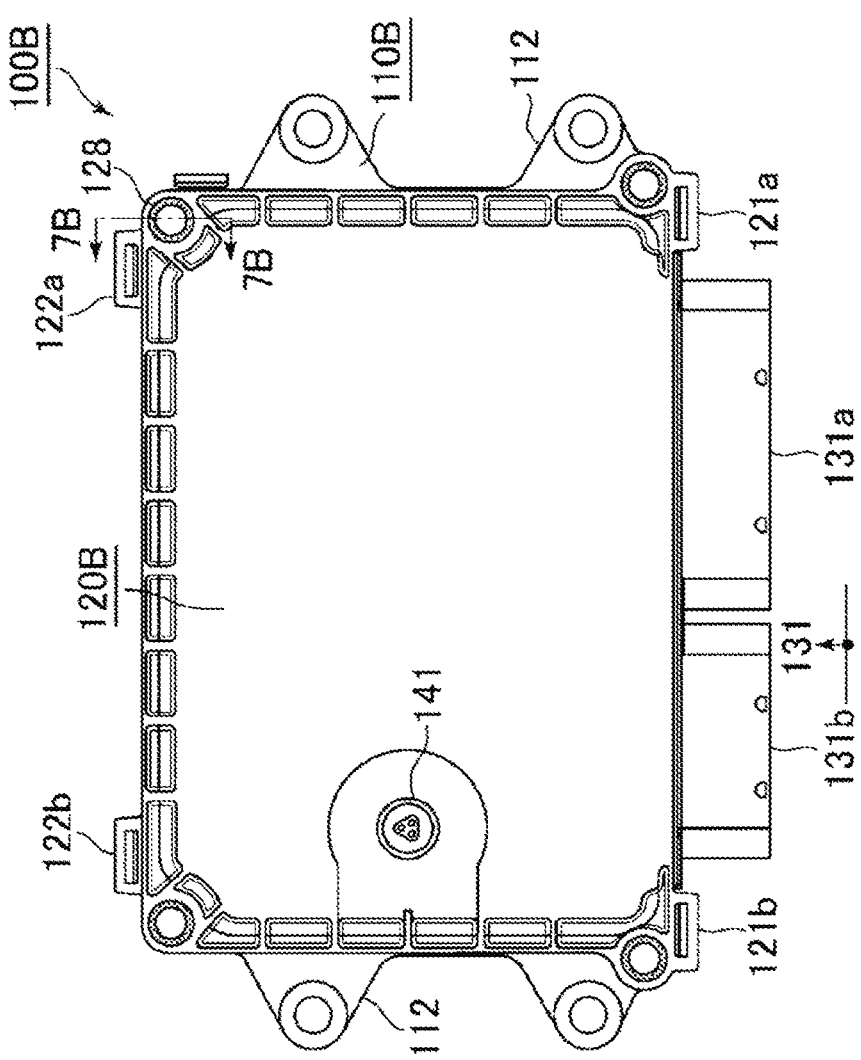

WATERPROOF TYPE SUBSTRATE HOUSING CASE

This application relates to a structure of a waterproof type substrate housing case applied to, for example, an electronic control device mounted in vehicle, in particular for the improvement of an integrated structure of a pair of cases constituting a housing case.

BACKGROUND ART

A waterproof type substrate housing case, wherein a rectangular circuit substrate is hermetically stored in a housing constituted by a first case and a second case, mounted on a first side of the circuit substrate, comprising a connector housing made of resin in which part of it is exposed from the opening of the housing, as well as a plurality of connection terminals press-fitted into the inner and outer partition walls of the connector housing wherein one end of the connection terminal is connected to the circuit pattern of the circuit substrate, and the other end has conductive contact with the contact terminal of the mating connector as a method for integrating the first case and the second case, is known to eliminate the screw tightening structure with poor assembling workability, and to use a snap fit.

For example, according to FIGS. 3 and 4 of the "driver device and motor device" described in the following patent literature 1, the opening part 11a of the case 11 is sealed with a cover 12 via a seal member J, by fitting the tongue part 17 of the cover 12 and the hook part 15 of the case 11, the cover 12 is prevented from falling off. The hook part 15 is configured to attract the case 11 and the cover 12 by the action of the inclined engagement surface 15a.

As a result, it is possible to suppress the deterioration of the sealing property while adopting the attachment structure by the snap fit, it is possible to prevent the case and the cover from being damaged and the increase in manufacturing cost can be suppressed, according to FIG. 1, an elastic clipping part formed by the hook part 15 and the tongue part 17 are provided at four positions on the four sides of the case 11.

PRIOR ART DOCUMENT

Patent Literature

[Patent Literature 1] JP2014-027773A (FIG. 3, [Summary], FIG. 1, FIG. 4)

Disclosure of Invention

Technical Problem

The "driver device and motor device" in the patent literature 1 is such that the cover 12 is pressed against the opening surface 11a of the case 11 by the elastic force of the tongue part 17, the pressing part force depends on the inclination angle of the engaging surface 15a of the hook part 11, further, since the actual pressing force is reduced by the frictional resistance between the engaging surface 15a of the hook part 11 and the tongue part 17, the seal member J is peeled off due to vibration of the vehicle body which is the mounting structure, there is a problem that the pressure holding retention strength between the cover 12 and the case 11 in the circuit substrate is lowered due to this peeling.

An object of the present application is to improve the vibration proof performance of a waterproof type substrate housing case integrating a first case and a second case holding a circuit substrate with a snap fit and an adhesive sealing material, and to provide a waterproof type substrate housing case in which the screw tightening operation becomes unnecessary even with a metal material with good heat conductivity.

Solution to Problem

In the waterproof type substrate housing case disclosed in this application, a rectangular circuit substrate is hermetically stored in a housing constituted by a first case made of metal and a second case made of resin, the waterproof type substrate housing case has a connector housing made of resin and mounted on the first side of the circuit substrate in which part of it is exposed from the opening of the housing, as well as a plurality of connection terminals press-fitted into the inner and outer partition walls of the connector housing, wherein one end of the connection terminal is connected to the circuit pattern of the circuit substrate, and the other end makes conductive contact with the contact terminal of the mating connector, and an annular adhesive sealant is applied to the outer periphery of the connector housing and is held in the opening of the housing.

In the circuit substrate, two orthogonal sides to the first side and the second side which is a side opposite to the first side, and three sides of a U-shape including the first side and the second side, are sandwiched by the three-sided holding surfaces of the first case and the second case, and a three-way adhesive sealing material is applied to the outer periphery of these three-sided holding surfaces, a pair of first side engaging elastic members are provided on the first side of the second case, a pair of orthogonal side engaging elastic members are provided on two orthogonal sides according to the first side, or a pair of second side engaging elastic members are provided on the second side opposite to the first side, each of the engaging elastic members of the first side, the two orthogonal sides and each engaging elastic member of the second side has a hook part that engages with an outer engaging surface part of the first case, each of the engaging elastic members is further connected to the second case via a pressing elastic member, each of the engaging elastic members and the pressing elastic members has a coupling inclination angle $\theta$ of less than 90 degrees, the relative planar position of the first case and the second case is regulated by an uneven regulating position or an uneven regulating member.

Advantageous Effects of Invention

According to the waterproof type substrate housing case disclosed in this application, the circuit substrate is housed in a hermetically sealed housing constituted by a first case, a second case and a three-way adhesive sealing material, a part of the connector housing mounted on the circuit substrate is configured to be exposed from the opening of the sealed housing via the annular adhesive seal material, the first case and the second case are pressed and fixed by a plurality of engaging elastic members, the engaging elastic member is fixed to the second case via a pressing elastic member having a connecting inclination angle of less than 90 degrees, the hook part provided at the tip of the engaging elastic member engages with the outer engaging surface part of the first case, the relative planar position between the first case and the second case is regulated by an uneven regulating position or an uneven regulating member.

Therefore, the engaging elastic member presses the side face of the first case to the side for preventing the hook part from coming off, the pressing elastic member has a function of press-contacting the first case and the second case by an elastic restoring force, as a result, the screws for fixing the first case and the second case by pressure welding are eliminated, it is possible to replace it with an engaging elastic member with good assembling workability, the engaging elastic member alone maintains the pressure contact state in a period until the adhesive seal material is dried and cured, since vibration resistance can be ensured in cooperation with the adhesive sealing material at the practical stage, even when a metal material having good heat dissipation property is used as the first case, vibration resistance can be maintained.

Since the sealing gap of the adhesive sealing material constituted by the sealing surfaces of the first case and the second case opposing each other is stably secured by the uneven regulating position or the uneven regulating member of the first case and the second case, the performance of integrating the first case and the second case with the adhesive sealing material is stabilized.

BRIEF DESCRIPTION OF DRAWINGS

FIG. 1A is a view showing an example of a waterproof type substrate housing case and is a top appearance view seen from the plan view according to the first embodiment of the present application.

FIG. 1B is a side appearance view of the waterproof type substrate housing case of FIG. 1A as seen in the direction of the arrow 1B in FIG. 1A.

FIG. 2A is a view for explaining the waterproof type substrate housing case shown in FIGS. 1A and 1B, and is an appearance view seen from the rear side.

FIG. 2B is a side appearance view of the waterproof type substrate housing case of FIG. 2A as seen in the direction of the arrow 2B in FIG. 2A.

FIG. 3A is a view for explaining a waterproof type substrate housing case shown in FIGS. 1A and 1B and is a side appearance view in the direction of the arrow 3A in FIG. 1A.

FIG. 3B is a side appearance view of the waterproof type substrate housing case of FIG. 3A as seen in the direction of the arrow 3B in FIG. 3A.

FIG. 4A is a view for explaining the waterproof type substrate housing case shown in FIGS. 1A and 1B, and is a cross-sectional view of the cross section taken along the line 4A-4A in FIG. 3A as viewed in the direction of the arrow.

FIG. 4B is a side appearance view of the waterproof type substrate housing case of FIG. 4A as seen in the direction of the arrow 4B in FIG. 4A.

FIG. 7A is a view showing an example of a waterproof type substrate housing case and is a backside appearance view according to the second embodiment of the present application.

FIG. 7B is a cross-sectional view of the cross section taken along line 7B-7B of FIG. 7A as seen in the direction of the arrow.

DESCRIPTION OF EMBODIMENTS

Figure 5A:
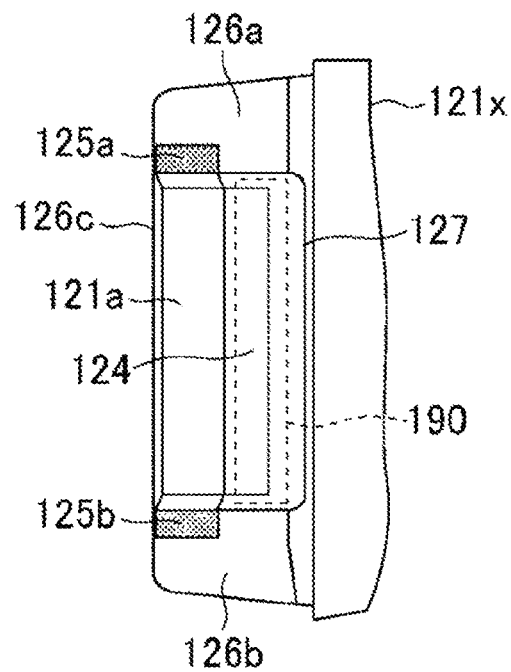
FIG. 5A is a top view of the engaging elastic member used in the waterproof type substrate housing case shown in FIGS. 1A and 1B.

First Embodiment (1) Detailed Description of Composition and Operation

The first embodiment of the present invention will be described according to FIGS. 1 to 6.

The configuration and operation in each figure will be sequentially and explained in detail, FIG. 1A which is a top external view of the waterproof type substrate housing case according to the first embodiment, FIG. 1B which is a side external view as seen in the direction of arrow 1B in FIG. 1A, FIG. 2A which is an external view of the rear surface of the waterproof type substrate housing case in FIG. 1A, the waterproof type substrate housing case in FIG. 2A wherein FIG. 2B is a side external view as seen in the direction of the arrow 2B in FIG. 2A, the waterproof type substrate housing case diagram shown in FIG. 1A wherein FIG. 3A which is a lateral external view seen in the direction of the arrow 3A in FIG. 1A, the waterproof type substrate housing case shown in FIG. 3A wherein FIG. 3B which is a side external view seen in the direction of the arrow 3B in FIG. 3A, FIG. 4A which is a cross-sectional view of the section taken along the line 4A-4A of FIG. 3A as seen in the direction of the arrow, and the waterproof type substrate housing case in FIG. 4A wherein FIG. 4B, which is a side external view as seen in the direction of the arrow 4B in FIG. 4A, First, in FIGS. 1A and 1B, in a waterproof type substrate housing case 100A, a first case 110A made of aluminum die-casting, and a second case 120A made of resin provided on the back surface, are integrally formed by later-described first side engaging elastic members 121*a* and 121*b* and orthogonal side engaging elastic members 123*a* and 123*b*, at the four corners of FIG. 1A which is a plan view. In the waterproof type substrate housing case 100A, a circuit substrate 130 (see FIG. 4A) on which a connector housing 131 including a first connector housing 131*a* and a second connector housing 131*b* is mounted is hermetically housed.

In the first case 110*a*, each hook part 124 (see FIG. 4A) of the first side engaging elastic members 121*a* and 121*b* provided on the second case 120*a* side as well as the orthogonal side engaging elastic members 123*a* and 123*b* provides the outer engaging surface part 111 to be engaged. Further, in the first case 110*a* having such a structure, a plurality of attachment fixing parts 112 attached and fixed to an attachment surface 194 (see FIG. 4A) and a plurality of radiation fins 113*b* provided in a canopy part 113*a* are provided.

Also, FIGS. 2A and 2B illustrate a water repellent filter 141 provided in the second case 120*a*. The water repellent filter 141 ventilates the inside and the outside in response to the pressure difference between the inside and the outside due to the temperature difference between the inside and outside of the waterproof type substrate housing case 100A. When this ventilation is performed, the water repellent filter 141 is constituted by a porous material prohibiting the movement of moisture accompanying aeration.

Further, in FIGS. 3A and 3B, with respect to the first and second connector housings 131*a* and 131*b* exposed from the opening formed on one side of the connector side by the first case 110*a* and the second case 120*a*, an annular adhesive sealing material 140*a* provided on the outer periphery thereof is shown, the annular adhesive sealing material 140*a* prevents water from entering from the opening. On the remaining three sides of the first case 110*a* and the second case 120*a*, a three-way adhesive sealing material 140*b* is provided.

The annular adhesive seal material 140*a* surrounding the connector housing 131 has a trapezoidal shape as illustrated in FIG. 3A. The oblique side part and the top side part of the trapezoidal annular adhesive seal material 140*a* are in contact with corresponding planar parts of the opening of the first case 110*a*, the bottom side part of the trapezoidal annular adhesive seal material 140*a* is brought into contact with the corresponding planar part of the opening part of the second case 120*a*, the annular adhesive seal material 140*a* is configured.

In addition, the bottom side part of the trapezoidal shape as illustrated in FIG. 3B, in order to connect with the three-way adhesive seal material 140*b*, the annular adhesive seal material 140*a* is configured.

Furthermore, as illustrated in FIGS. 4A and 4B, three sides are clamped by the first case 110*a* and the second case 120*a*, and a three-way adhesive sealing material 140*b* is provided on the outside.

On the side surface of the second case 120*a*, a pressing elastic member 121*x* is provided. The pressing elastic member 121*x* is formed by pressing, when pressed upward from the jig base 192 provided on the jig bottom surface 193 of the assembling jig shown by a dotted line, it provides elasticity curving upward in FIG. 4A. When the jig is removed, due to the restoring force of the pressing elastic member 121*x*, the first case 110*a* and the second case 120*a* are brought into pressure contact via the first side engagement elastic members 121*a* and 121*b* and the hook part 124.

In addition, a first side engaging elastic member 121*a* is provided at an end part of the pressing elastic member 121*x*, the first side engaging elastic member 121*a* has a connecting inclination angle θ and stands up in a substantially right angle direction. The hook part 124 is provided at the end part of the first side engaging elastic member 121*a* and engages with the outer engaging surface part 111 of the first case 110*a*.

In order to enhance the elastic engaging force with the outer engaging surface part 111 of the first side engaging elastic member 121*a*, as illustrated in FIG. 4B, reinforcing arc-shaped part 125*a* and 125*a* are provided on both side surfaces of the first side engaging elastic member 121*a*.

Further, in order to prevent the bottom surface part of the pressing elastic member 121*x* from being pressed from the side of the mounting surface, a setting gap G0 is provided between the attachment surface of the attachment fixing part 112 provided in the first case 110*a* and the bottom surface of the pressing elastic member 121*x*.

Figure 5C:
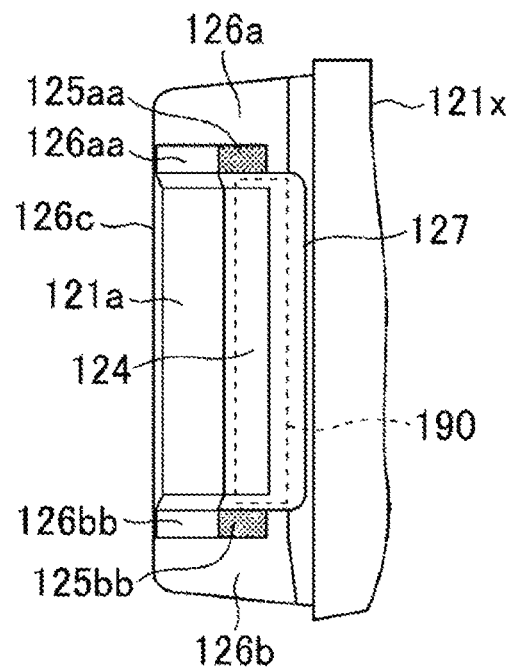
FIG. 5C is a top view illustrating a modified form of the engaging elastic member used in the waterproof type substrate housing case shown in FIGS. 1A and 1B.
Figure 5B:
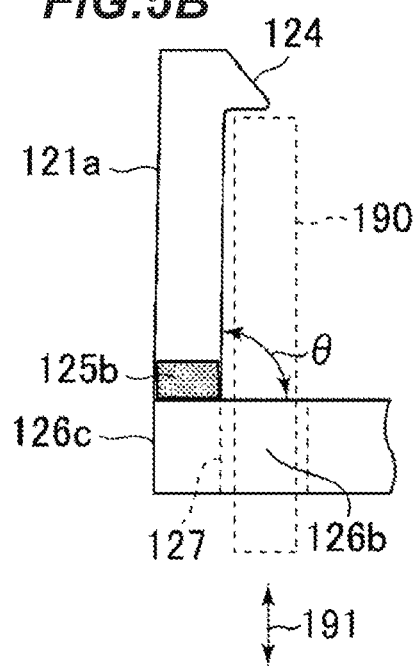
FIG. 5B is a side view of the engaging elastic member of FIG. 5A.
Figure 6A:
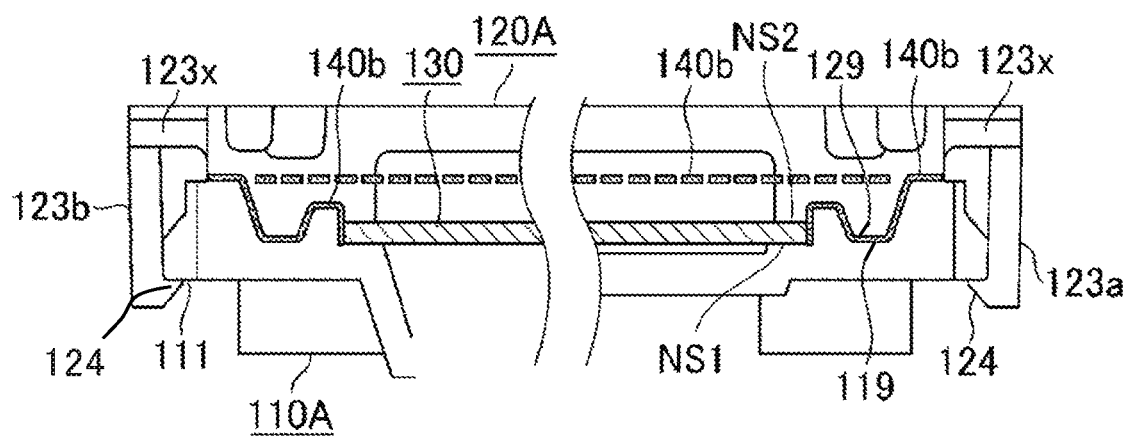
FIG. 6A is a view for explaining the waterproof type substrate housing case shown in FIGS. 1A and 1B, and is a cross-sectional view of the cross section taken along the line 6A-6A in FIG. 2A as viewed in the direction of the arrow.
Figure 6B:
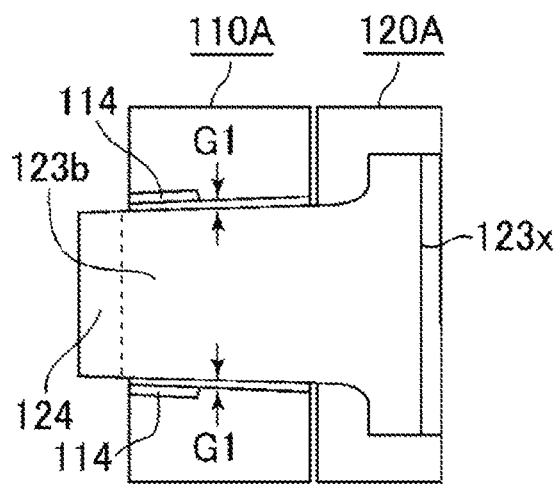
FIG. 6B is a view for explaining a waterproof type substrate housing case shown in FIGS. 1A and 1B and is a side appearance view in the direction of the arrow 6B in FIG. 1A.
Figure 6C:
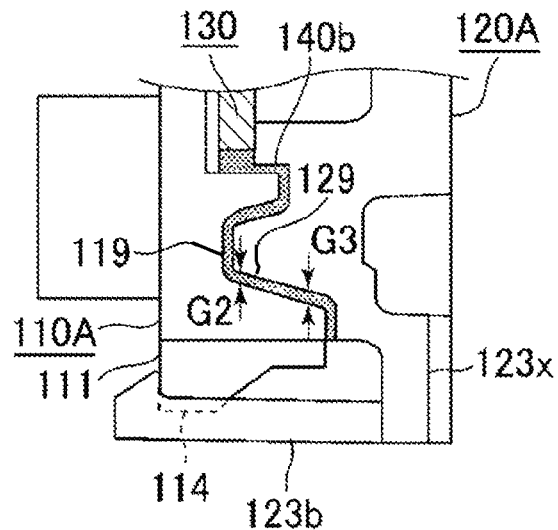
FIG. 6C is a cross-sectional view of the cross section taken along the line 6C-6C in FIG. 1A as viewed in the direction of the arrow.

Next, the configuration and operation in each figure will be sequentially and in detail explained, FIG. 5A which is a top view of the engaging elastic member used in the waterproof type substrate housing case shown in FIGS. 1A and 1B, FIG. 5B which is a side view of the engaging elastic member used in the waterproof type substrate housing case shown in FIGS. 1A and 1B, FIG. 6A which is a cross-sectional view of the section taken along line 6A-6A of FIG. 2A as viewed in the direction of the arrow, FIG. 6B which is a side external view seen in the direction of the arrow 6B in FIG. 1A, and FIG. 6C which is a cross-sectional view of the cross section taken along the line 6C-6C of FIG. 1A as viewed in the direction of the arrow.

First, in FIGS. 5A and 5B, on the end face of the pressing elastic member 121*x* provided on the side surface of the second case 120*a*, the bottom part of the engaging part 126*c* is provided via a pair of connecting members 126*a* and 126*b*, thereby, a punched hole part 127 is constituted. The first side engaging elastic member 121*a* having a connecting inclination angle θ stands up on the bottom part of the engaging part 126*c*. By inserting and withdrawing a metal mold (not shown) in the direction of arrow 191 with respect to the mold insertion part 190, the inner surface of the first-side engaging elastic member 121*a* and the hook part 124 are generated.

The pair of first side engaging elastic members 121*a* and 121*b* and the pair of orthogonal side engaging elastic members 123*a* and 123*b* have a common structure. Then, as in the explanation in FIG. 4A, when the jig in FIG. 4A is removed when the jig is removed, due to the restoring force of the pressing elastic member 123*x*, the first case 110A and the second case 120A are brought into pressure contact via the orthogonal side engagement elastic members 123*a* and 121*b* and the hook part 124.

Figure 5D:
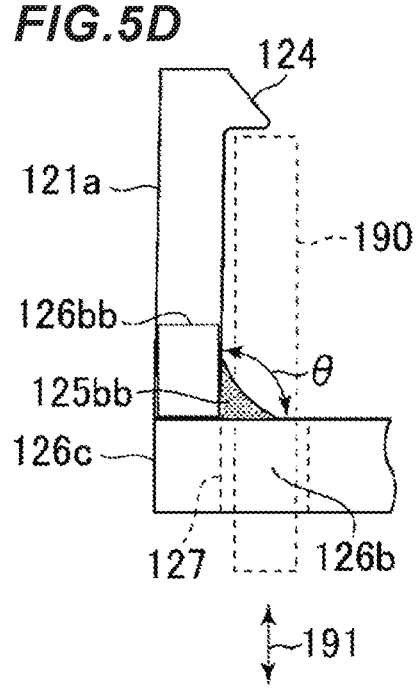
FIG. 5D is a side view of the engaging elastic member of FIG. 5C.

In FIGS. 5C and 5D showing a top view and a side view of the engaging elastic member, which is a modification of the engaging elastic member illustrated in FIGS. 5A and 5B, the first side engaging elastic member 121*a* has engaging widening part 126*aa* and 126*bb*. The engagement widened parts 126*aa* and 126*bb* are connected to each other via the reinforcing arc-shaped parts 125*aa* and 125*bb*, and is integrated with the connecting members 126*a* and 126*b*. In FIG. 5C, the reinforcing arc-shaped parts 125*aa* and 125*bb* provided on the right side of the engagement widened part 126*aa* and 126*bb* are formed in a rectangular shape, and can also be provided on the left side of the engagement widened parts 126*aa* and 126*bb*.

In FIG. 6A, an adhesive sealing surface 119 to be a concave part and an adhesive sealing surface 129 to be a convex part are provided on three sides of the first case 110A and the second case 120A so as to face each other. With such a structure, in the adhesive sealing gap formed between the adhesive sealing surface 119 and the adhesive sealing surface 129, for example, a three-way adhesive sealing material 140*b*, which is a one-component cold-setting adhesive or two-component thermosetting adhesive, is applied, the adhesive sealing material 140*b* cooperates with the annular adhesive seal material 140*a* described above with reference to FIGS. 3A and 3B, the first case 110A, the second case 120A, and the connector housing 131 are integrated, by this integration, a hermetically sealed housing that houses the circuit substrate 130 in a sealed state is constituted.

On the side surface of the second case 120*a*, a pressing elastic member 123*b* is provided.

On the left and right of the second case 120A, orthogonal side engaging elastic members 123*b* and 123*a* are provided via the pressing elastic members 123*x* and 123*x*. The hook part 124 provided at the distal end part of the orthogonal side engaging elastic members 123*b*, engages with the outer engaging surface part 111 of the first case 110A, until at least the annular adhesive seal material 140*a* and the three-way adhesive sealing material 140*b* are sufficiently cured, by the plurality of orthogonal side engaging elastic members 123*a* and 123*b* and the first side engaging elastic members 121*a* and 121*b* (see FIG. 1A), the first case 110A, the second case 120A, and the connector housing 131 are integrated, by this integration, a hermetically sealed housing for housing the circuit substrate 130 is constituted.

In FIG. 6B, the orthogonal side engaging elastic member 123*b* provided upright on the pressing elastic member 123*x* of the second case 120, and is opposed to the position regulating protruding piece 114 provided on the first case 110A via the uneven regulating gap G1. Accordingly, in FIG. 1A, even if the second case 120A is pressed upward in FIG. 1A by the first side engaging elastic members 121*a* and 121*b*, the uneven distribution of the second case 120A is regulated by the uneven regulating gap G1 provided in the orthogonal side engaging elastic members 123*a* and 123*b*, and the occurrence of unevenness of the adhesive sealing gap with respect to this direction is suppressed.

In FIG. 6C, on the three sides of the first case 110A and the second case 120A, the adhesive sealing surface 119 to be a concave part and the adhesive sealing surface 129 to be a convex part are provided to face each other, the adhesive sealing gap constituted by such a structure, the rear end groove gap G3 is larger than the front end groove gap G2 on the sloping side. Accordingly, in FIG. 1A, even if the second case 120A is pressed in the left-right direction in FIG. 1A (vertical direction in FIG. 6C) by the orthogonal side engaging elastic members 123*a* and 123*b*, the uneven distribution of the second case 120A is restricted by the uneven regulating gap G1 provided in the first side engaging elastic members 121*a* and 121*b*, and the occurrence of unevenness of the adhesive sealing gap with respect to this direction is suppressed.

(2) Summary and Features of the First Embodiment

As is clear from the above description, in the waterproof type substrate housing case 100A according to the first embodiment, a rectangular circuit substrate 130 is hermetically stored in a housing constituted by a first case 110A made of metal and a second case made of resin, mounted on the first side of the circuit substrate 130, comprising a connector housing 131 made of resin in which part of it is exposed from the opening of the housing, as well as a plurality of connection terminals 132 press-fitted into the inner and outer partition walls of the connector housing 131, wherein one end of the connection terminal is connected to the circuit pattern of the circuit substrate 130, and the other end makes conductive contact with the contact terminal of the mating connector, an annular adhesive sealant 140*a* is applied to the outer periphery of the connector housing, two sides orthogonal to each other including the two sides orthogonal to the first side and the second side which is opposite to the first side and the second side in the opening of the housing, the circuit substrate 130 is sandwiched by three-sided holding surfaces NS1, NS2 of the first case 110A and the second case 120A, and a three-way adhesive sealing material 140*b* is applied to the outer periphery of the three-sided holding surface.

As shown in FIG. 6A, the three-sided holding surface NS1 of the first case 110A and the three-sided holding surface NS2 of the second case 120A holding the three sides of the circuit substrate 130, and the third side and the fourth side as the two orthogonal sides shown as the both end edges of the circuit substrate 130 arranged in the horizontal state are clamped, the horizontal width part having a predetermined dimension from the outer end edge is held by the three-sided holding surfaces NS1, NS2. On the second side which is the opposite side of the first side of the circuit substrate 130 on which the connector housing 131 is mounted, a horizontal width part having a predetermined dimension from the outer end edge is sandwiched by the three-sided holding surfaces NS1 and NS2.

A pair of first side engaging elastic members 121*a* and 121*b* are provided on the first side of the second case 120A, a pair of orthogonal side engaging elastic members 123*a* and 123*b* are provided on two orthogonal sides according to the first side, each of the engaging elastic members of the first side and the two orthogonal sides have a hook part 124 that engages with the outer engaging surface part 111 of the first case 110A, the respective engaging elastic members are connected to the second case 120A via each of the engaging elastic member and the pressing elastic members 121*x* and 123*x*, each of the engaging elastic members and the pressing elastic member 121*x* and 123*x* has a coupling inclination angle θ of less than 90 degrees, the relative planar position between the first case 110A and the second case 120A is regulated by the uneven regulating position G1, G2, G3 or the uneven regulating member 128.

Accordingly, the engaging elastic members 121*a*, 121*b*, 123*a*, on the side that prevents disengagement (disconnect/unlatch) of the hook part 124 from the outer engaging surface part 111, the side surface of the first case 110A is pressed, the pressing elastic member 121*x* has a function of press-contacting the first case 110A and the second case 120A by its own elastic restoring force, as a result, the screws conventionally used for press-contacting and fixing the first case 110A and the second case 120A to each other are eliminated, it can be replaced by an engaging elastic member with good assembling workability.

Therefore, the engaging elastic members 121*a*, 121*b*, 123*a*, 123*b* maintain the pressure contact state in a period until the adhesive seal material 140*a*, 140*b* are dried and cured, since vibration resistance can be ensured with the adhesive sealing material 140*a* and 140*b* at the practical stage, even when a metal material having good heat dissipation property is used as the first case 110A, vibration resistance can be maintained.

Since the sealing gap of the adhesive sealing material constituted by the sealing surfaces of the first case 110A and the second case 120A opposing each other is stably secured by the uneven regulating position G1, G2, G3 of the first case 110A and the second case 120A or the uneven regulating member 128, the performance of integrating the first case 110A and the second case 120B with the adhesive sealing material is stabilized.

The engaging elastic members 121*a*, 121*b*, 123*a*, 123*b* stand up at the end part of the pressing elastic members 121*x*, 123*x*, with respect to the bottom part of the engaging part 126*c* connected via the pair of connecting members 126*a* and 126*b* has a pair of reinforcing arc-shaped parts 125*a*, 125*b*, or the engaging widening parts 126*aa* and 126*bb* provided on the respective engaging members and a pair of reinforcing arc-shaped parts 125*aa* and 125*bb* provided between the pair of connecting members 126*a* and 126*b*.

As described above, in relation to the technical feature item 2 of this application, on both sides of the engaging elastic members 121*a*, 121*b*, 123*a*, 123*b* standing on the end parts of the pressing elastic members 121*x*, 123*x* of the second case 120A, a pair of reinforcing arc-shaped parts 125*a*, 125*b*, 125*aa*, 125*bb* are provided. Accordingly, the strength of the engaging elastic members 121*a*, 121*b*, 123*a*, 123*b* for pressing the side surface of the first case 110A can be increased, the hook part 124 of the respective engaging elastic members 121a, 121b, 123a, 123b can be generated by a simple metal mold structure.

This feature applies for the second embodiment in the same way.

The first case 110A includes an attachment fixing part 112 to be fixed to the attachment surface 194 of the attachment subject, further, between the attachment surface 194 and the pressing elastic members 121x, 123x, a setting gap G0 having a size equal to or larger than the elastic deformation amount of the pressing elastic members 121x, 123x is provided.

As described above, according to the technical feature item 3 of the present application, a space of the setting gap G0 is provided on the back surface of the pressing elastic members 121x and 123x on the mounting surface 194 side. Therefore, for example, when the mounting surface 194 is deformed, or in the case where a foreign object is interposed in the space of the setting gap G0, the pressing elastic members 121x and 123x are pressed and deformed, it is possible to prevent the press-contact force between the first case 110A and the second case 120A from being reduced.

This feature applies for the second embodiment in the same way.

The seal grooves filled with the annular adhesive seal material 140a (see FIGS. 3A and 3B) and the three-way adhesive sealing material 140b (see FIGS. 4A, 6A, and 6C) are opposed to each other, (see FIGS. 6A and 6C) and the adhesive seal surface 119 (see FIGS. 6A and 6C) which serves as a slope-shaped convex part, further, the front end groove gap G2 of the seal groove is set to be smaller than the rear end groove gap G3 of the seal groove, and these constitute the uneven regulating position.

As described above, according to the technical feature item 5 of this application, the front end groove gap G2 of the seal groove filled with the annular adhesive seal material 140a and the three-way adhesive sealing material 140b is set to be smaller than the rear end groove gap G3 of the seal groove. Accordingly, the deviation between the center position of the first case 110A and the center position of the second case 120A, which is caused by pressing the first case 110A in the planar direction by the plurality of engagement elastic members 121a, 121b, 123a, 123b is regulated by the front end groove gap G2 of the seal groove, also, there is a feature that the adhesion strength between the first case 110A and the second case 120A can be suppressed from being lowered by the adhesive seal material in the rear end groove gap G3.

This feature applies for the second embodiment in the same way.

The outer engaging surface part 111 of the outer peripheral end face of the first case 110A is provided with position regulating protruding piece 114 protruding on both sides of the plurality of engaging elastic members 121a, 121b, 123a, 123b, further, the position regulating protruding piece 114 faces both side faces of the engaging elastic members 121a, 121b, 123a, 123b via the uneven regulating gap G1, these configurations are the uneven regulating member and the uneven regulating position.

As described above, according to the technical feature item 6 of the present application, the position regulating protruding piece 114 protruding to the outer peripheral end face of the first case 110A is brought into contact with the engaging elastic members 121a, 121b, 123a, 123b, respectively. Therefore, even if the first case 110A is pressed in the planar direction by the plurality of engaging elastic members 121a, 121b, 123a, 123b, since the pressing position is restricted by the uneven regulating gap G1 in the engaging elastic member orthogonal to the pressing direction, a reduction in the bonding strength between the first case 110A and the second case 120A with respect to this direction is suppressed.

This feature applies for the second embodiment in the same way.

Second Embodiment (1) Detailed Description of Composition and Operation

Regarding FIG. 7A which is an external view of the rear surface of the waterproof type substrate housing case according to the second embodiment and FIG. 7B which is a cross-sectional view taken along the line 7B-7B of FIG. 7A as seen in the arrow direction, the configuration and operation thereof will be described focusing on differences from the first embodiment.

The difference in the embodiment is indicated by the difference in alphabet of uppercase letters in the reference numerals in the figure. For example, the waterproof type substrate housing case 100B in each of FIGS. 7A and 7B, which exemplifies the second embodiment, corresponds to the waterproof type substrate housing case 100A according to the first embodiment. Further, in the first embodiment, by the first side engaging elastic members 121a, 121b and the orthogonal side engaging elastic members 123a, 123b as described above, the first case 110A and the second case 120A are integrated. In contrast, in the second embodiment, by the first side engaging elastic members 121a, 121b and the second side engaging elastic members 122a, 122b, the first case 110B and the second case 120B are integrated.

First, in FIGS. 7A and 7B, in the waterproof type substrate housing case 100B, the first case 110B made of aluminum die-casting provided at the position of the surface in FIG. 7A, and the second case 120B made of resin provided at the position of the surface in FIG. 7A, are integrally formed at the first side engaging elastic members 121a and 121b and second side engaging elastic members 123a and 122b, at the four corners. In the waterproof type substrate housing case 100B, the circuit substrate 130 (see FIG. 4A) on which the connector housing 131 including the first connector housing 131a and the second connector housing 131b mounted is hermetically housed. Accordingly, similarly to the case described with reference to FIG. 4A, the first case 110B, the first case engaging elastic members 121a and 121b provided on the side of the second case 120B and the outer engaging surface part 111 engaged with the hook part 124 of the second side engaging elastic members 122a and 122b, further, the waterproof type substrate housing case 100B is provided with a plurality of attachment fixing parts 112 attached and fixed to the attachment surface 194 (see FIG. 4A) and a plurality of radiation fins 113b provided on the canopy part 113a.

The waterproof type substrate housing case 100B according to the second embodiment includes the concavity part 118 provided at the four corners of the first case 110B and the protruding part 128 provided at the four corners of the second case 120B. The concavity part 118 and the protruding part 128 are provided at a pair of diagonal positions of at least the waterproof type substrate housing case 100B and are fitted to each other. The concavity part 118 and the protruding part 128 which are fitted to each other are the uneven regulating member for determining the relative planar position between the first case 110B and the second case 120B.

In the case where the concavity part 118 serving as the uneven regulating member and the protruding part 128 are provided, the uneven regulating gap G1 in FIG. 6B is unnecessary, and it is sufficient to make it a sufficiently large gap. In addition, the front end groove gap G2 and the rear end groove gap G3 in FIG. 6C can be made the same size. In the first embodiment, as in the second embodiment, it is also possible to provide the concavity part 118 and the protruding part 128, which are uneven regulating members.

In the above description, the first case 110A and the first case 110B are both made of aluminum die-cast, but since the heat generated by the heat-generating components in the waterproof type substrate housing case 100A; 100B is small, in the case of the waterproof type substrate housing case which does not require the radiation fin 113b, the first case 110A, 110B may be made of sheet metal. When the first case 110A, 110B is lightweight, it is also possible to provide the mounting fixing part 112 on the side of the second case 120A, 120B.

(2) Summary and Features of the Second Embodiment

As it is clear from the above description, in the waterproof type substrate housing case 100B according to the second embodiment, a rectangular circuit substrate 130 is hermetically stored in a housing constituted by a first case 110B made of metal and a second case 120B made of resin, mounted on the first side of the circuit substrate 130, comprising a connector housing 131 made of resin in which part of it is exposed from the opening of the housing, as well as a plurality of connection terminals 132 press-fitted into the inner and outer partition walls of the connector housing 131, wherein one end of the connection terminal is connected to the circuit pattern of the circuit substrate 130, and the other end makes conductive contact with the contact terminal of the mating connector, an annular adhesive sealant 140a is applied to the outer periphery of the connector housing, two sides orthogonal to each other including the two sides orthogonal to the first side and the second side which is opposite to the first side and the second side in the opening of the housing, the circuit substrate 130 is sandwiched by three-sided holding surfaces of the first case 110B and the second case 120B, and a three-way adhesive sealing material 140b is applied to the outer periphery of the three-sided holding surface.

As in FIG. 6A, the three-sided holding surface NS1 (see FIG. 6A) of the first case 110B and the three-sided holding surface NS2 (see FIG. 6A) of the second case 120B holding the three sides of the circuit substrate 130, and the third side and the fourth side as the two orthogonal sides shown as the both end edges of the circuit substrate 130 arranged in the horizontal state are clamped, the horizontal width part having a predetermined dimension from the outer end edge is held by the three-sided holding surfaces. On the second side which is the opposite side of the first side of the circuit substrate 130 on which the connector housing 131 is mounted, a horizontal width part having a predetermined dimension from the outer end edge is sandwiched by the three-sided holding surfaces. The clamping relationship by the three-sided holding surface is the same as the holding relationship of the three-way holding surfaces NS1, NS2 shown in FIG. 6 A in FIG. 6 described in the first embodiment.

Then, a pair of first side engaging elastic members 121a and 121b are provided on the first side of the second case 120B, a pair of second-side engaging elastic members 122a, 122b are provided on a second side that is the opposite side of the first side, each of the engaging elastic members of the first side and the second side has a hook part 124 engaged with the outer engaging surface part 111 of the first case 110B, each of the engaging elastic members is connected to the second case 120B via pressing elastic member 121x and 122x (not shown), the engaging elastic members and the pressing elastic member 121x and 122x (not shown) have a coupling inclination angle θ of less than 90 degrees, the relative planar position between the first case 110B and the second case 120B is regulated by the uneven regulating members 118, 128 (see FIG. 7B).

At least a pair of diagonal positions of the first case 110B and the second case 120B is provided with concavity part 118 and protruding part 128 to be engaged with each other. Further, the concavity part 118 and the protruding part 128 fitted to each other are the unevenly regulating members. As described above, according to the technical feature item 4 of this application, the diagonal positions of the first case and the second case are provided with concavity part 118 and protruding part 128 to be fitted to each other. Accordingly, when the first case 110B is pressed in the planar direction by the plurality of engaging elastic members 121a, 121b, 123a, 123b, a shift occurs between the center position of the first case 110B and the center position of the second case 120B, by doing so, variations occur in the seal gap to which the adhesive sealant is applied, as a result, there is a feature that the reduction in the bonding strength between the first case and the second case can be suppressed beforehand.

This feature applies for the second embodiment in the same way.

In the drawings, the same reference numerals indicate the same or corresponding parts.

Although the present application is described above in terms of an exemplary embodiment, it should be understood that the various features, aspects and functionality described in the embodiment are not limited in their applicability to the particular embodiment with which they are described, but instead can be applied, alone or in various combinations to the embodiment. It is therefore understood that numerous modifications which have not been exemplified can be devised without departing from the scope of the present application. For example, at least one of the constituent components may be modified, added, or eliminated.

REFERENCE SIGNS LIST 100A 100B Waterproof type substrate housing case,
110A 110B First case (base),
111 Outer engaging surface part,
112 Mounting fixing part,
114 Position regulating protruding piece (uneven regulating member),
118 Concavity (uneven regulating member),
119 Adhesive sealing surface (concave part)
120A 120B Second case (base),
121A 121b First side engaging elastic member,
121X Pressing elastic member,
122A 122b Second side engaging elastic member,
(122X) Pressing elastic member,
123A 123b Orthogonal side engaging elastic member,
123X Pressing elastic member,
124 Hook part,
125A 125b Reinforcing arc-shaped parts,
125aa 125bb Reinforcing arc-shaped parts,
126A 126b Connecting member,
126Aa 126bb Engaging widening part,
126C Bottom part of the engaging part,
128 Protrusion (uneven regulating member),
129 Adhesive sealing surface (convex part)
130 Circuit substrate,
131 Connector housing, 132 Connection terminal part,
140A Annular adhesive seal material,
140b Three-way adhesive sealing material,
192 Jig support,
193 Jig bottom surface,
194 Attachment surface,
G0 Setting gap,
G1 Uneven regulating gap (uneven regulating position),
G2 Front end groove gap (uneven regulating position),
G3 Rear end groove gap (uneven regulating position),
θ Coupling inclination angle,
NS1 Three-sided holding surfaces of the first case,
NS2 Three-sided holding surfaces of the second case.

The invention claimed is:

1. A waterproof type substrate housing case, wherein;
a rectangular circuit substrate is hermetically housed in a housing case composed of a metal first case and a second case made of resin,
a connector housing made of resin which is mounted on the first side of the circuit substrate and is partially exposed from an opening of the housing case, and a plurality of connection terminals press-fitted into inner and outer partition walls of the connector housing are provided,
one end of each connection terminal is connected to a circuit pattern of the circuit substrate, and the other end is in conductive contact with a contact terminal of the mating connector,
an annular adhesive seal material is applied to an outer periphery of the connector housing, and is sandwiched between the openings of the housing case,
in the circuit substrate, two orthogonal sides to a first side and a second side which is a side opposite to the first side, and three sides of a U-shape including the first side and the second side, are held by the three-way holding surface of the first case and the second case,
a three-way adhesive sealing material is applied to an outer periphery of the three-way holding surfaces,
a pair of first side engaging elastic members is provided on the first side of the second case,
a pair of orthogonal side engaging elastic members are provided on two orthogonal sides according to the first side, or a pair of second side engaging elastic members are provided on the second side opposite to the first side, each of the engaging elastic members of the first side,
the two orthogonal sides of the first side and the engaging elastic members of the second side has a hook part that engages with an outer engaging surface part of the first case,
each of the engaging elastic members is further connected to the second case via a pressing elastic member,
each of the engaging elastic members and the pressing elastic members has a coupling inclination angle θ of less than 90 degrees, and
a relative planar position of the first case and the second case is regulated by an uneven regulating position or an uneven regulating member.

2. The waterproof type substrate housing case according to claim 1, wherein
the engaging elastic members provided at end parts of the pressing elastic members have a pair of reinforcing arc-shaped parts with respect to an engaging base part connected via a pair of connecting members and stand up.

3. The waterproof type substrate housing case according to claim 1, wherein
at least one of the first case and the second case includes an attachment fixing part to be fixed to the attachment surface of the attachment subject, further, between the attachment surface and the pressing elastic members, a setting gap having a size equal to or larger than the elastic deformation amount of the pressing elastic members is provided.

4. The waterproof type substrate housing case according to claim 2, wherein
at least one of the first case and the second case includes an attachment fixing part to be fixed to the attachment surface of the attachment subject, further, between the attachment surface and the pressing elastic members, a setting gap having a size equal to or larger than the elastic deformation amount of the pressing elastic members is provided.

5. The waterproof type substrate housing case according to claim 1, wherein
at least a pair of diagonal positions of the first case and the second case are provided with a concavity part and a protruding part to be engaged with each other, and
the concavity part and the protruding part are the uneven regulating member.

6. The waterproof type substrate housing case according to claim 2, wherein
at least a pair of diagonal positions of the first case and the second case are provided with a concavity part and a protruding part to be engaged with each other, and
the concavity part and the protruding part are the uneven regulating member.

7. The waterproof type substrate housing case according to claim 3, wherein
at least a pair of diagonal positions of the first case and the second case are provided with a concavity part and a protruding part to be engaged with each other, and
the concavity part and the protruding part are the uneven regulating member.

8. The waterproof type substrate housing case according to claim 4, wherein
at least a pair of diagonal positions of the first case and the second case are provided with a concavity part and a protruding part to be engaged with each other, and
the concavity part and the protruding part are the uneven regulating member.

9. The waterproof type substrate housing case according to claim 1, wherein
seal grooves filled with the annular adhesive seal material and the three-way adhesive sealing material of which an adhesive seal surface being slope-shaped convex part and an adhesive seal surface being slope-shaped concave part are opposed to each other,
a front end groove gap of the seal groove is set to be smaller than a rear end groove gap of the seal groove, and
the slope-shaped convex part and the slope-shaped concave part constitute the uneven regulating position.

10. The waterproof type substrate housing case according to claim 2, wherein
seal grooves filled with the annular adhesive seal material and the three-way adhesive sealing material of which an adhesive seal surface being slope-shaped convex part and an adhesive seal surface being slope-shaped concave part are opposed to each other,
a front end groove gap of the seal groove is set to be smaller than a rear end groove gap of the seal groove, and the slope-shaped convex part and the slope-shaped concave part constitute the uneven regulating position.

11. The waterproof type substrate housing case according to claim 3, wherein
seal grooves filled with the annular adhesive seal material and the three-way adhesive sealing material of which an adhesive seal surface being slope-shaped convex part and an adhesive seal surface being slope-shaped concave part are opposed to each other,
a front end groove gap of the seal groove is set to be smaller than a rear end groove gap of the seal groove, and
the slope-shaped convex part and the slope-shaped concave part constitute the uneven regulating position.

12. The waterproof type substrate housing case according to claim 4, wherein
seal grooves filled with the annular adhesive seal material and the three-way adhesive sealing material of which an adhesive seal surface being slope-shaped convex part and an adhesive seal surface being slope-shaped concave part are opposed to each other,
a front end groove gap of the seal groove is set to be smaller than a rear end groove gap of the seal groove, and
the slope-shaped convex part and the slope-shaped concave part constitute the uneven regulating position.

13. The waterproof type substrate housing case according to claim 1, wherein
an outer peripheral end face of the first case is provided with a position regulating protruding piece protruding on both sides of the plurality of engaging elastic members,
the position regulating protruding piece faces both side faces of the engaging elastic members via the uneven regulating gap, and
the position regulating protruding piece and both side faces of the engaging elastic members are the uneven regulating member and the uneven regulating position.

14. The waterproof type substrate housing case according to claim 2, wherein
an outer peripheral end face of the first case is provided with a position regulating protruding piece protruding on both sides of the plurality of engaging elastic members,
the position regulating protruding piece faces both side faces of the engaging elastic members via the uneven regulating gap, and
the position regulating protruding piece and both side faces of the engaging elastic members are the uneven regulating member and the uneven regulating position.

15. The waterproof type substrate housing case according to claim 3, wherein
an outer peripheral end face of the first case is provided with a position regulating protruding piece protruding on both sides of the plurality of engaging elastic members,
the position regulating protruding piece faces both side faces of the engaging elastic members via the uneven regulating gap, and
the position regulating protruding piece and both side faces of the engaging elastic members are the uneven regulating member and the uneven regulating position.

16. The waterproof type substrate housing case according to claim 4, wherein
an outer peripheral end face of the first case is provided with a position regulating protruding piece protruding on both sides of the plurality of engaging elastic members,
the position regulating protruding piece faces both side faces of the engaging elastic members via the uneven regulating gap, and
the position regulating protruding piece and both side faces of the engaging elastic members are the uneven regulating member and the uneven regulating position.

* * * * *